United States Patent
Wang et al.

(10) Patent No.: US 6,864,176 B2
(45) Date of Patent: Mar. 8, 2005

(54) FABRICATION PROCESS FOR BONDED WAFER PRECISION LAYER THICKNESS CONTROL AND ITS NON-DESTRUCTIVE MEASUREMENT METHOD

(75) Inventors: Hung-Dar Wang, Kaohsiung (TW); Ruey-Shing Huang, Putz (TW); Shih-Chin Gong, Taipei (TW); Chung-Yang Tseng, Taipei (TW)

(73) Assignee: Asia Pacific Microsystems, Inc., Hsinchu (TW)

( * ) Notice: Subject to any disclaimer, the term of this patent is extended or adjusted under 35 U.S.C. 154(b) by 113 days.

(21) Appl. No.: 10/155,008

(22) Filed: May 28, 2002

(65) Prior Publication Data

US 2003/0224610 A1 Dec. 4, 2003

(51) Int. Cl.$^7$ ............................................. H01L 21/302
(52) U.S. Cl. ......................... 438/691; 438/14; 438/406; 438/692; 438/706
(58) Field of Search ................................ 438/691, 692, 438/706, 710, 406, 14

(56) References Cited

U.S. PATENT DOCUMENTS

| | | | | |
|---|---|---|---|---|
| 5,686,364 A | * | 11/1997 | Ohki et al. | 438/406 |
| 5,981,400 A | * | 11/1999 | Lo | 438/745 |
| 6,286,685 B1 | * | 9/2001 | Kononchuk et al. | 209/2 |
| 6,489,624 B1 | * | 12/2002 | Ushio et al. | 250/559.27 |

* cited by examiner

*Primary Examiner*—Lan Vinh
(74) *Attorney, Agent, or Firm*—Troxell Law Office PLLC

(57) ABSTRACT

A measurement method for the thinned thickness of the silicon wafer, wherein thickness inspection patterns are fabricated onto the silicon wafer substrate by anisotropic etching, and then the wafer is polished with a polisher; thus a wafer with desired thickness can be obtained after the polish is proceeded; the thickness of the upper wafer is determined by the said inspection patterns, then the wafer is sorted by thickness; thus it can be applied to the MEMS micromachined devices that in need of the wafer with such precise thickness.

8 Claims, 4 Drawing Sheets

FABRICATION PROCESS FOR BONDED WAFER PRECISION LAYER THICKNESS CONTROL AND ITS NON-DESTRUCTIVE MEASUREMENT METHOD

BACKGROUND OF THE INVENTION

1. Field of the Invention

The present invention relates to a silicon-bonded wafer, and the measurement method for measuring the thickness of the upper wafer during or after it was thinned.

2. Description of the Related Background

In the semiconductor wafer bonding technology, there is a technique for bonding two wafers together to form a new wafer, that is, two silicon wafers (with silicon oxide, silicon nitride or nothing on the surface thereof) are adhered together by the Van der Waal's force therein, and then bonded in high temperature. The new wafer, of which the thickness of the upper wafer is thinned to a specific thickness by polishing process, thus it becomes a thin film layer on the new wafer, and a new wafer with a new structure is accomplished. It can be provided for the devices that are in need of the wafer with such structure for the follow-up processes. In the polishing process, it is a very important procedure that the way to measure the thickness after the upper wafer had been thinned and then to sort the wafers according to the specifications thereof.

In the processes for manufacturing MEMS devices, diaphragm are applied for many purposes. The properties of the MEMS devices, such as the pressure sensors and the accelerometers, are concerned with the thickness of the diaphragm. After the process for bonding the two silicon wafers, one of the wafers is polished and thinned, and a diaphragm is formed. With respect to the measurement of the wafer thickness, there are two types of methods for the measurement as follows:

The first one is a measurement method applying a polisher with a contact altimeter. The thickness of the wafer is firstly measured by the altimeter, then the thickness to be removed is calculated, after that, the polishing time of the polisher is set according to the used remove rate of the polisher. Thus, a wafer with expected thickness is obtained, and then it is measured again by the altimeter for determining the specifications. Such method is applied commonly by the industrial circles. However, while a plurality of wafers are going to be polished, since the wafers thickness are varied from several to tens of $\mu$m, and since the variation of the derived stress and the remove rate would influence the results of polishing. On basis of the above reasons, the thickness of the polished wafers are varied from several tens of $\mu$m. In order to obtain a wafer with more precise thickness, a generally used method is to sort the wafers by measuring the thickness. However, as the two wafers are bonded, the thickness of the upper wafer that thinned is hard to be measured individually.

The second one is a non-contact, instantaneous optical measurement method. It applies a phenomenon that when the surface of the to-be-measured material is illuminated by a light source, a part of the light would be reflected by the first material (namely received reflective signal 1), the another part of the light would be transmitted through the first material. Once the light is in contact with the second material that different from the first material, reflection and transmission is occurred again. As the reflected light is transmitted out of the to-be-measured materials (namely received reflective signal 2), two parallel reflective optical signals are received by the sensor, and the thickness of the to-be-measured materials can be figured out immediately. This method can be applied to chemical mechanical polishing, especially for the layer of material in order to improve surface smoothness. However, it is not a suitable method for independently measuring the reduced thickness of a single layer from the two bonded wafers, which are made of the same material of silicon.

Accordingly, the present invention provides a measurement method for measuring the thickness of a single layer from the silicon wafers that are thinned after bonded together. Since the silicon lattice having the property of anisotropic etching (as shown in FIG. 1, in a KOH solution, the etching rate of silicon (100) is much greater than that of silicon (111)). Several inspection patterns with varied size is generated on one side of the wafer, and then after it is proceeded with silicon bulk micromachining for a specific time, several V-grooves with varied depth for inspection is formed. The V-groove inspection pattern is shown in FIG. 1 and the included angle between the silicon (100) and the silicon (111) is 54.7°. The actual thickness of the upper wafer after polished can be calculated by measuring the size of the gaps of the polished V-grooves, and then it is sorted according to the remaining thickness. The MEMS microsensor devices, such as silicon-based piezoresistive pressure sensors or accelerometers etc., of which the output signals is in concerned with the thickness of the diaphragm, by applying this method, the polished upper wafer can be sorted by thickness precisely. Consequently, the micromachined devices with similar magnitude of output signals can be accomplished.

3. Description of the Prior Art

Some measurements for the polished thickness of a wafer have been disclosed before, such as the mechanical contacting measurement or the optical non-contacting measurement, and they are now described as below:

(1) In the thickness measurement in a rear wafer polishing process of the Taiwan Pat. No. 359,746 disclosed by P. W. Tsai et al, wherein a mechanical measurement is applied. The total thickness of wafer can be measured by a diamond probe 21 contacting to the wafer 20, then the obtained signals are transmitted to the signal detector inside the measuring box 23 by the measuring rod 22. Please refer to FIG. 2 and the reference material (1) for details.

(2) In the chemical mechanical polishing process of the U.S. Pat. No. 6,301,006 disclosed by Trung T. Doan, wherein the non-contacting instantaneous optical measurement is applied for measuring the thickness. The wafer 30 is put in the wafer carrier 31. Then, the measuring surfaces on the wafer carrier is detected by the detector above in order to measure the parameters upon the wafer thickness and the remove rate during the wafer polished. Please refer to FIG. 3 and the reference material (2) for details.

(3) In the chemical mechanical polish of the U.S. Pat. No. 6,071,177 disclosed by C. L. Lin et al, wherein the thickness is measured by non-contacting instantaneous optical measurement, specially for the silica film thickness control for polishing the silicon wafer. An optical detector module 41 is placed under the light-permeable polishing pad, and then the wafer is rotated around the center of the polishing pad. Once the wafer 40 is passed through the optical detector module 41, the film thickness is measured. Please refer to FIG. 4 and the reference material (3) for details.

In applying the methods disclosed above, the thickness of an individual layer of the two wafers, which are bonded together and polished, cannot be measured effectively. Therefore, a new method for measuring the thickness of the polished wafer is required for overcoming the properties variations of the sensor devices caused by the thickness variations of the upper silicon wafer.

SUMMARY OF THE INVENTION

It is an object of the present invention to provide a new measurement method for the polished thickness of the wafer. Since the thin silicon wafers are easy to be broken during the wafers is being bonded, so thicker wafers are required for bonding and then polishing. In the present invention, several patterns with varied size is formed by photolithography process initially before bonding the wafers, and then the V-groove patterns are fabricated by bulk micromachining for inspection after the wafers are bonded together and polished. It is provided with simplified fabrication process and measurement, and high-precision measurement is provided. By using this measurement method for polished thickness of the wafer, the upper wafer can be sorted more precisely by thickness; thus, it is applicable to the follow-up micro-sensor process that required for two bonded and polished wafers.

The above objectives and advantages will become more apparent with explanation of the accompanying drawings.

DETAILED DESCRIPTION OF THE PREFERRED EMBODIMENT

An embodiment of the present invention will now be explained in detail with reference to the accompanying drawings. Here, a silicon substrate is used as the material of the structure. Thickness inspection patterns are defined on one side of the upper wafer by photolithography, and the inspection marks are fabricated by anisotropic etching. Then, the upper wafer is bonded with another wafer. Afterwards, the other side of the upper wafer is polished, and the remain thickness is precisely determined by the inspection marks fabricated on the first side of the upper wafer. Thus, the thickness of diaphragm obtained by polishing the silicon wafer can be sorted precisely.

Nevertheless, the practical fabrication of the device is not required to be submitted exactly to the above-mentioned process. It is clear that many other variations would be possible without departing from the basic approach, demonstrated in the present invention.

EXAMPLE 1

Figure 1:
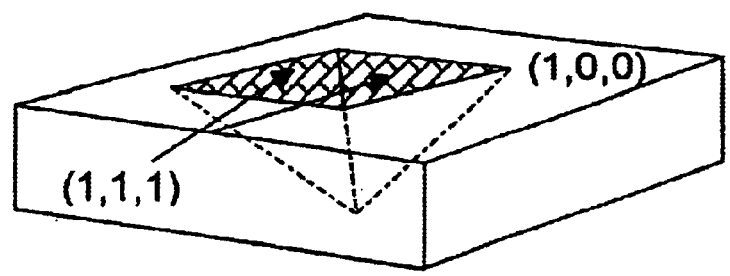
FIG. 1 is a perspective view showing the layout of a V-groove on a wafer generated by anisotropic etching.
Figure 2:
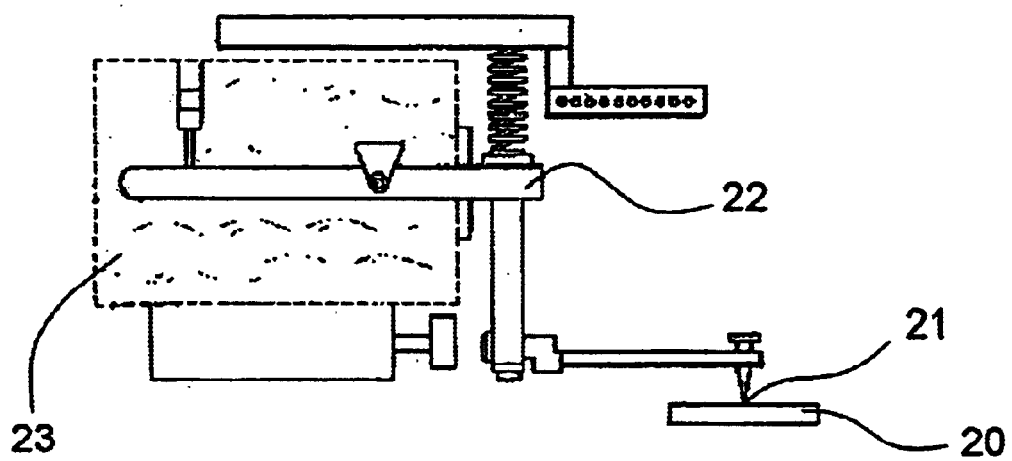
FIG. 2 is a perspective view showing a measurement device for wafer thickness disclosed on the R.O.C. Patent No. 359,746.
Figure 3:
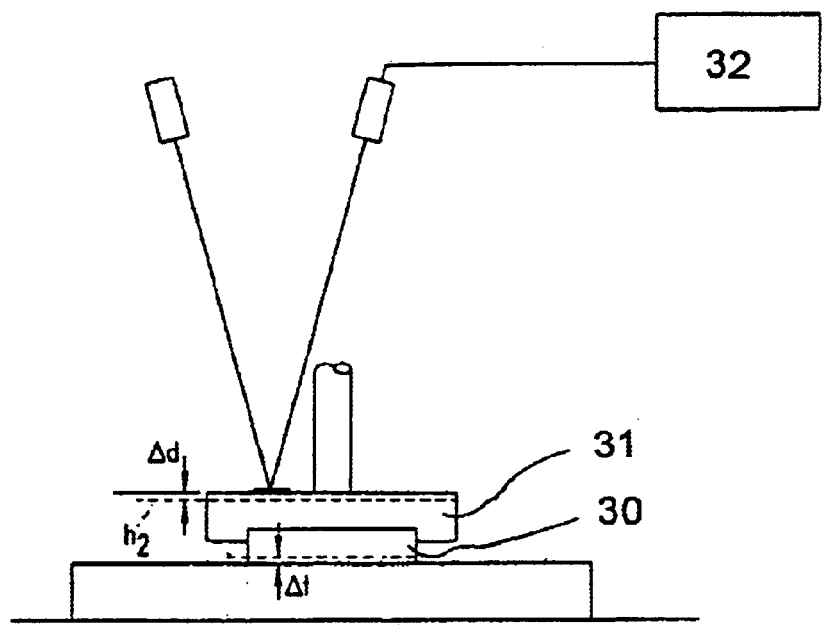
FIG. 3 is a perspective view showing a measurement device for wafer thickness disclosed on the U.S. Pat. No. 6,301,006.
Figure 4:
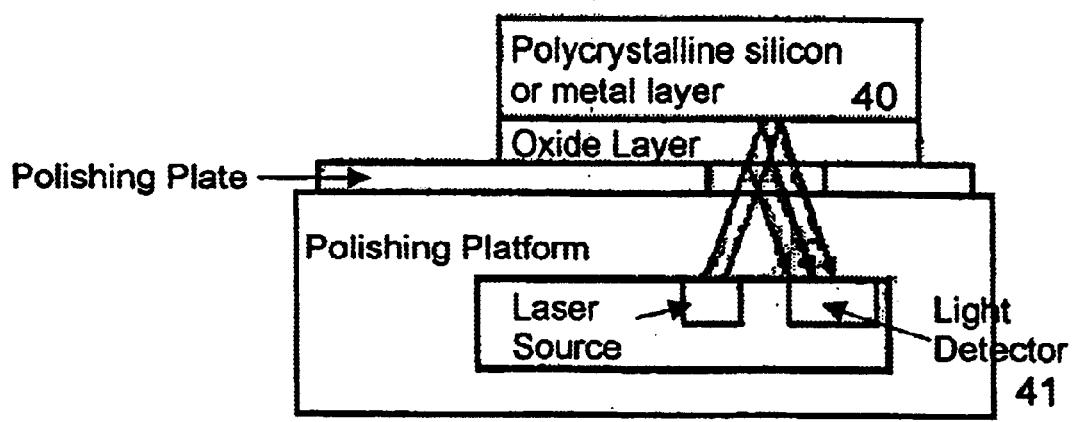
FIG. 4 is a perspective view showing a polish device disclosed on the U.S. Pat. No. 6,071,177.
Figures 5A, 5B:
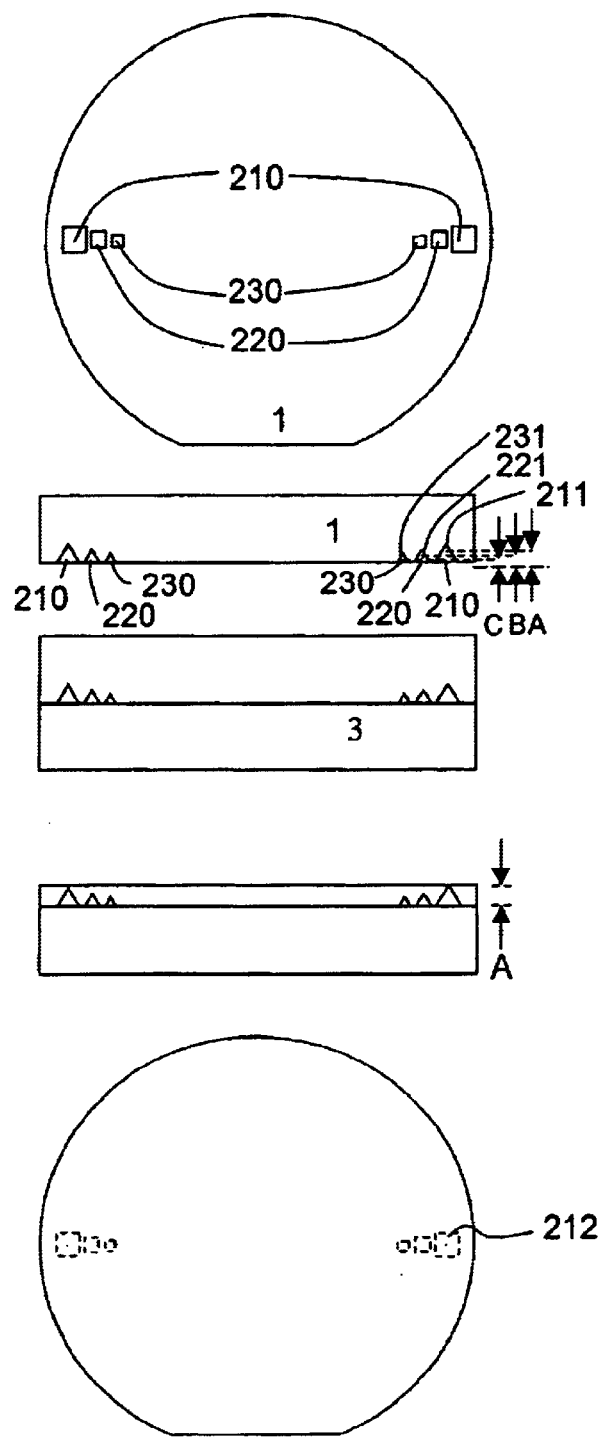
FIGS. 5A and 5B are the flowcharts showing the fabrication processes of wafer polishing and thickness inspection according to the present invention.

FIGS. 5A and 5B are the flowcharts of the polished wafer inspection process. Thickness inspection patterns 210, 220 and 230 are defined onto a first side of the silicon substrate 1 (with silicon oxide, silicon nitride or nothing on the surface), and it is proceeded the photolithography. Then, by using KOH for anisotropic wet etching, the above-mentioned patterns 210, 220 and 230 are etched to be V-grooves 211, 221 and 231. Afterwards, by silicon fusion bonding process, the first side of the above-mentioned silicon substrate is bonded with another silicon substrate 3 (with silicon oxide, silicon nitride or nothing on the surface). After the two wafers are bonded together, the upper wafer is polished, and then a thinner wafer is formed; this is the wafer for fabrication of the micro-sensor device. The bonded wafer is being polished from upper wafer until the V-groove, and a square gap generated on the polished wafer surface. The thickness of silicon diaphragm can be calculated precisely according to the dimension of gap, and the bonded wafer can be sorted according to the thickness of diaphragm for determining if within the specification. Compared with the general measuring process using a polisher, a thickness measurement in bonded wafers are provided according to the present invention, and furthermore, its diaphragm after polished can be measured and sorted by an optical microscope.

Figure 6:
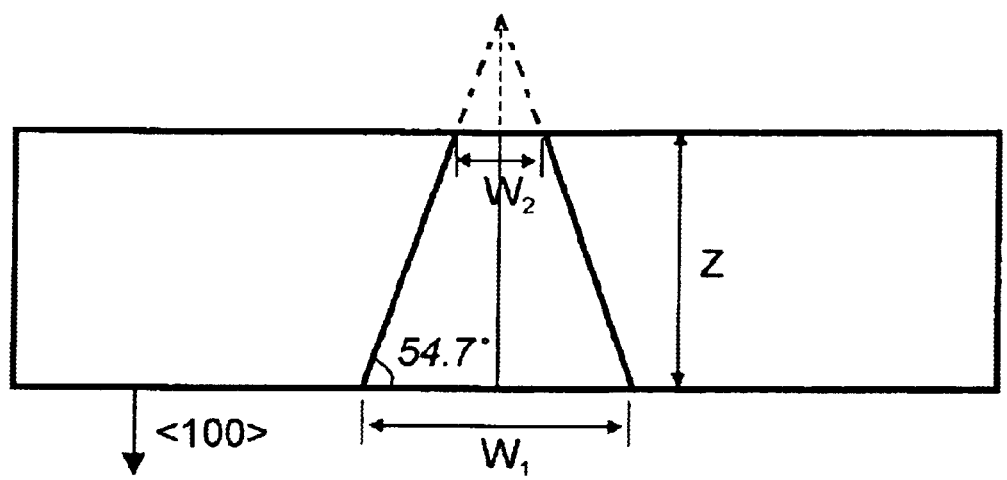
FIG. 6 shows the relationship between the polished wafer and the gap of the V-groove for inspecting for calculating the remaining thickness.

As shown in FIG. 5, the size of the square of the thickness inspection pattern 210, 220 and 230 can be 28.3 $\mu$m, 26.9 $\mu$m and 25.5 $\mu$m respectively. According to the related equation, of which the included angel between silicon (100) and silicon (111) is 54.7°, the depth A, B and C of the V-grooves 211, 221 and 231 are 20.0 $\mu$m, 19.0 $\mu$m and 18.0 $\mu$m. The gaps of the V-grooves can be observed by a microscope, thus the dimension thereof can be measured. By means of the geometry relationship shown in FIG. 6, the remaining thickness of the upper wafer after polished can be figure out as $$Z=[(W1-W2)/2] \tan (54.7°).$$

The thickness of the upper wafer can be calculated, and the wafer can be sorted according to it, thus no need for applying any other measurement apparatus to measure the wafer thickness.

EXAMPLE 2

Presently, silicon diaphragm is usually used in the MEMS devices as sensing mechanism, such as silicon piezoresistive pressure sensor applies diaphragm to sense the variation of pressure. Since the sensitivity for pressure is influenced exactly by the thickness of silicon diaphragm, so it is very important to control its thickness precisely in order to ensure the efficiency of the devices.

Figure 7:
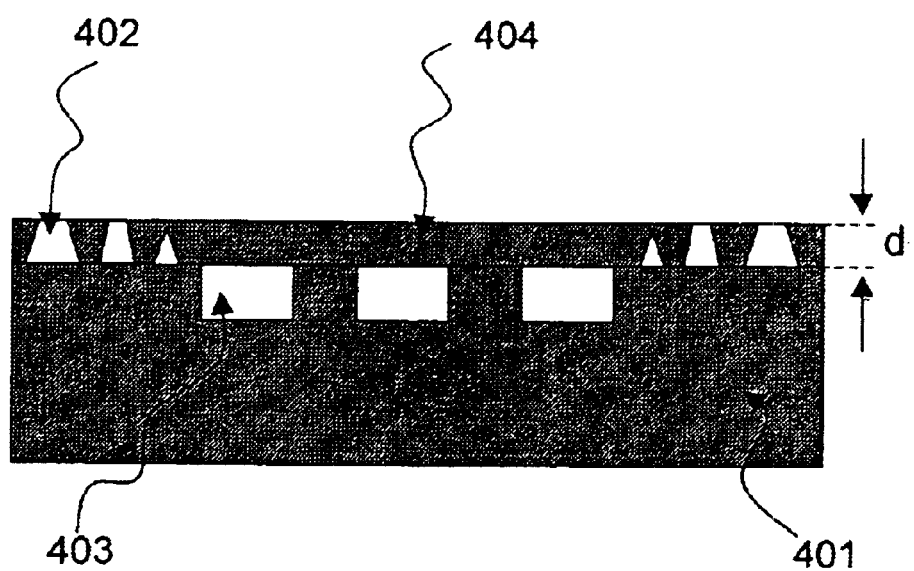
FIG. 7 is a perspective view showing the wafer, which is proceeded with the fabrication process of the thickness inspection patterns, is applied to the micro-sensor devices.

Please refer to FIG. 7. The fabrication process is the same as that of the example 1, only the cavities 403 are etched on the bonding side of the lower wafer 401 initially by the Induction Coupling Plasma Reactive Ion Etching machine (ICP RIE), then the follow-up process of bonding and polishing are proceeded. In order to control the thickness precisely, the thickness ruler (20.0 $\mu$m, 19.0 $\mu$m and 18.0 $\mu$m) are fabricated onto the upper silicon wafer 404 by the thickness measurement of present invention, and then bonded with the lower silicon wafer with etched cavities by silicon fusion bonding. Afterwards, the upper wafer is thinned by polishing process of used technology, and the thickness measurement is proceeded. Thus, a silicon diaphragm with precise thickness is obtained; such diaphragm can be applied for sensing the difference of pressure from inside and outside. The thickness of diaphragm according to this embodiment is d=18.0 μm.

As described above, the new measurement method for the upper silicon wafer thickness and standards, wherein no need to be applied with complicated supplementary devices. The practical thickness of silicon diaphragm can be figured out according to the size of the gaps of the V-grooves, or whether the gaps exist or not, so as to ensure the uniform properties of the sensing devices.

REFERENCE MATERIALS (1) P. W. Tsai, W. J. Tseng, J. J. Lee and T. T. Tsai, "a Measurement Device for Wafer Thickness", Taiwan Patent, Patent Number: 359,746.
(2) Trung T. Doan, "Endpoint Detector and Method for Measuring a Change in Wafer Thickness", U.S. Pat. No. 6,301,006 B1 (2001).
(3) C. L. Lin, Tin Chun Wang, "Method and Apparatus for Determining End Point in a Polishing Process", U.S. Pat. No. 6,071,177 (2000).

What is claimed is:

1. A measurement method for measuring the thickness of a thinned wafer, which comprises the steps of:
   a) forming a plurality of thickness-inspection patterns on a first side of a first wafer substrate with photolithography;
   b) forming V-grooves by etching the plurality, of thickness-inspection patterns with anisotropic etching;
   c) bonding the first side of a first wafer substrate to a second wafer substrate;
   d) thinning the first wafer substrate by removing substrate from a second side thereof to expose a vertex of at least one of the plurality of V-grooves thereby producing at least one gap on the second side of the first wafer substrate;
   e) calculating a thickness of the first silicon wafer by measuring a size of the at least one gap on the second side of the first wafer substrate; and
   f) sorting the first wafer substrate by the thickness thereof calculated from the size of the at least one gap.

2. The measurement method according to claim 1, wherein the thinning step d) utilizes a thinning process selected form the group of processes consisting of lapping, grinding, polishing, chemical mechanical polishing, and combinations thereof.

3. The measurement method according to claim 1, wherein the thickness-inspection patterns are one of square-composed or rectangular-composed.

4. The measurement method according to claim 1, wherein the step of bonding c) utilizes silicon fusion bonding.

5. The measurement method according to claim 1, wherein the first wafer substrate is a wafer with an orientation of (100).

6. The measurement method according to claim 1, wherein the second wafer substrate is a wafer with an orientation selected from the group consisting of (100), (110), and (111).

7. The measurement method according to claim 1, wherein the first wafer substrate is selected from the group of wafers consisting of a silicon wafer, a wafer with silicon oxide on a surface, and a wafer with silicon nitride on a surface.

8. The measurement method according to claim 1, wherein the second wafer substrate is selected from the group of wafers consisting of a silicon wafer, a wafer with silicon oxide on a surface, and a wafer with silicon nitride on a surface.

* * * * *